United States Patent
Shen et al.

(10) Patent No.: US 11,532,553 B2
(45) Date of Patent: Dec. 20, 2022

(54) MIDDLE-END-OF-LINE STRAP FOR STANDARD CELL

(71) Applicant: TAIWAN SEMICONDUCTOR MANUFACTURING CO., LTD., Hsinchu (TW)

(72) Inventors: Meng-Hung Shen, Hsinchu County (TW); Chih-Liang Chen, Hsinchu (TW); Charles Chew-Yuen Young, Cupertino, CA (US); Jiann-Tyng Tzeng, Hsinchu (TW); Kam-Tou Sio, Hsinchu County (TW); Wei-Cheng Lin, Taichung (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 17/133,264

(22) Filed: Dec. 23, 2020

(65) Prior Publication Data

US 2021/0118793 A1 Apr. 22, 2021

Related U.S. Application Data

(60) Division of application No. 16/264,622, filed on Jan. 31, 2019, now Pat. No. 10,879,173, which is a
(Continued)

(51) Int. Cl.
*H01L 23/528* (2006.01)
*H01L 49/02* (2006.01)
(Continued)

(52) U.S. Cl.
CPC .......... *H01L 23/528* (2013.01); *H01L 21/762* (2013.01); *H01L 21/76877* (2013.01);
(Continued)

(58) Field of Classification Search
CPC ............. H01L 23/528; H01L 21/76877; H01L 23/5226; H01L 27/0924; H01L 29/66795; H01L 28/00
(Continued)

(56) References Cited

U.S. PATENT DOCUMENTS 6,404,023 B1 6/2002 Mori et al.
6,720,628 B2 4/2004 Karasawa et al.
(Continued)

FOREIGN PATENT DOCUMENTS

JP 2001-196474 A1 7/2001
KR 10-0215887 B1 8/1999
KR 10-2013-0083358 A1 7/2013

*Primary Examiner* — Thinh T Nguyen
(74) *Attorney, Agent, or Firm* — Maschoff Brennan

(57) ABSTRACT

A semiconductor structure is disclosed that includes a first conductive line, a first conductive segment, a second conductive segment, and a gate. The first conductive segment is electrically coupled to the first conductive line through a conductive via. The second conductive segment is configured to electrically couple the first conductive segment with a third conductive segment disposed over an active area. The gate is disposed under the second conductive segment and disposed between first conductive segment and the third conductive segment. The first conductive line and the second conductive segment are disposed at two sides of the conductive via respectively. A length of the first conductive segment is greater than a length of the third conductive segment.

20 Claims, 7 Drawing Sheets

Related U.S. Application Data continuation of application No. 15/817,119, filed on Nov. 17, 2017, now Pat. No. 10,204,857, which is a division of application No. 15/058,077, filed on Mar. 1, 2016, now Pat. No. 9,837,353.

(51) Int. Cl.

| | |
|---|---|
| *H01L 27/088* | (2006.01) |
| *H01L 27/092* | (2006.01) |
| *H01L 21/762* | (2006.01) |
| *H01L 21/768* | (2006.01) |
| *H01L 23/522* | (2006.01) |
| *H01L 29/423* | (2006.01) |
| *H01L 29/66* | (2006.01) |
| *H01L 27/02* | (2006.01) |
| *H01L 29/78* | (2006.01) |

(52) U.S. Cl.
CPC .... *H01L 21/76895* (2013.01); *H01L 23/5226* (2013.01); *H01L 27/0886* (2013.01); *H01L 27/0924* (2013.01); *H01L 28/00* (2013.01); *H01L 29/42356* (2013.01); *H01L 29/66795* (2013.01); *H01L 23/5283* (2013.01); *H01L 27/0207* (2013.01); *H01L 29/785* (2013.01); *H01L 2924/01029* (2013.01)

(58) Field of Classification Search
USPC .................. 257/368, 371, 774; 438/118, 199
See application file for complete search history.

(56) References Cited

U.S. PATENT DOCUMENTS

| | | |
|---|---|---|
| 8,455,924 B2 | 6/2013 | Greenberg et al. |
| 2002/0135003 A1 | 9/2002 | Karasawa et al. |
| 2002/0135021 A1 | 9/2002 | Karasawa et al. |
| 2002/0135027 A1* | 9/2002 | Karasawa et al. ...... H01L 27/11 257/377 |
| 2006/0181309 A1 | 8/2006 | Nakanishi |
| 2012/0261749 A1 | 10/2012 | Yamada |
| 2013/0181297 A1 | 7/2013 | Liaw |
| 2013/0200472 A1 | 8/2013 | Sunamura et al. |

* cited by examiner

MIDDLE-END-OF-LINE STRAP FOR STANDARD CELL

RELATED APPLICATION

This application is a divisional of U.S. application Ser. No. 16/264,622, filed Jan. 31, 2019, now U.S. Pat. No. 10,879,173, issued Dec. 29, 2020, which is a continuation of U.S. application Ser. No. 15/817,119, filed Nov. 17, 2017, now U.S. Pat. No. 10,204,857, issued Feb. 12, 2019, which is a divisional of U.S. application Ser. No. 15/058,077, filed Mar. 1, 2016, now U.S. Pat. No. 9,837,353, issued Dec. 5, 2017, all of which are herein incorporated by reference.

BACKGROUND

Semiconductor fabrication of integrated circuits (ICs) includes, for example, front-end-of-line (FEOL), middle-end-of-line (MEOL), and back-end-of-line (BEOL) processes. Traditionally, during the FEOL process, semiconductor structures are formed on a semiconductor wafer. The semiconductor structures are then locally interconnected during the MEOL process to form the integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
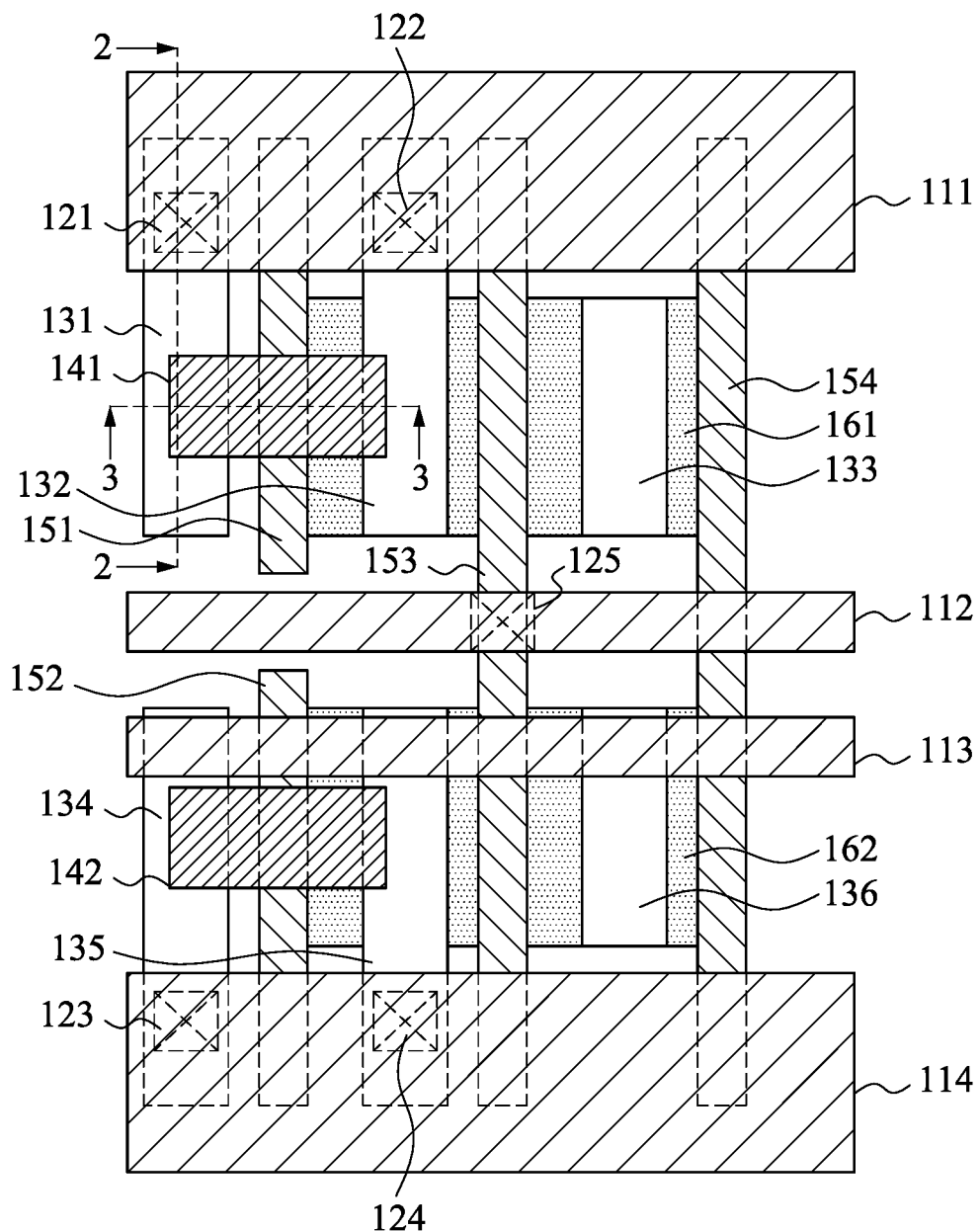
FIG. 1 is a top view of a schematic layout of a semiconductor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Semiconductor fabrication of integrated circuits (ICs) includes, for example, front-end-of-line (FEOL), middle-end-of-line (MEOL), and back-end-of-line (BEOL) processes. The FEOL process includes, for example, wafer preparation, isolation, well formation, gate patterning, spacer, extension and source/drain implantation, silicide formation, and dual stress liner formation. The MEOL process includes, for example, gate contact formation. The BEOL process includes, for example, a series of wafer processing steps for interconnecting the semiconductor structures formed during the FEOL and MEOL processes. Some portions of layouts of semiconductor structures in following embodiments of the present disclosure are associated with, and/or formed in, for example, the MEOL process. Layouts of semiconductor structures in following embodiments associated with, and/or formed in, various processes are within the contemplated scope of the present disclosure.

FIG. 1 is a top view of a schematic layout of a semiconductor structure 100, in accordance with some embodiments of the present disclosure. In some embodiments, the semiconductor structure 100 represents a standard cell. The standard cell, in some embodiments, refers to a pre-designed cell that has been laid out and stored in a circuit library that is in a form of a database. Moreover, the standard cell, in some embodiments, is stored in a tangible storage medium, including, for example, a hard drive. In the design of integrated circuits, the standard cell is retrieved from the circuit library, and is placed in a placement operation. The placement operation is performed, for example, using a computer, which runs the software for designing integrated circuits. The soft ware includes a circuit layout tool, which has a function of placement and routing.

In some embodiments, the semiconductor structure 100 of FIG. 1, which will be illustrated in detail below, is used to form transistors including, for example, Fin Field-Effect Transistor (FinFET), planar transistor, or the like. In further embodiments, the transistors formed with the semiconductor structure 100 constitute a complementary metal-oxide-semiconductor (CMOS) device. For illustration, the semiconductor structure 100 includes an N-type metal-oxide-semiconductor (NMOS) transistor and/or a P-type metal-oxide-semiconductor (PMOS) transistor. One of ordinary skill in the art will appreciate that the above examples are given for illustrative purposes. Various devices implemented by the semiconductor structure 100 are within the contemplated scope of the present disclosure.

Components of the semiconductor structure 100, as will be illustrated below, are disposed, in some embodiments, over a semiconductor substrate, which, for convenience of illustration, is not shown in FIG. 1. The semiconductor substrate is a silicon substrate or other suitable semiconductor substrate.

For illustration in FIG. 1, the semiconductor structure 100 includes active areas 161 and 162. In some embodiments, the active area 161 is a P-type active area, and the active area 162 is an N-type active area. The P-type active area is arranged to form PMOS transistors, and the N-type active area is arranged to form NMOS transistors.

The above types of the active areas 161 and 162 are given for illustrative purposes. Various types of the active areas 161 and 162 are within the contemplated scope of the present disclosure. In some embodiments, the term "active area" discussed in the present disclosure is also referred to as "OD" (oxide dimensioned area).

As illustrated in FIG. 1, the semiconductor structure 100 also includes gates 151-154. The gate 151 is disposed over the active area 161, the gate 152 is disposed over the active area 162, and both of the gates 153 and 154 are disposed over the active areas 161 and 162. For illustration, the gates 151-154 are arranged in parallel with each other and equally spaced apart.

In some embodiments, the gates 151-154 are formed of poly silicon. Accordingly, the term "gate" discussed in the present disclosure is also referred to as "PO" in some embodiments. Various conductive materials used to form the gates 151-154 are within the contemplated scope of the present disclosure. For example, in various embodiments, the gates 151-154 are formed of metals, metal alloys, metal silicides, or the like.

For illustration in FIG. 1, the gates 151 and 154 are disposed over, and cover, opposite edges of the active area 161. The gates 152 and 154 are disposed over, and cover, opposite edges of the active area 162. Accordingly, the gates 151, 152 and 154 are also referred to as "PODE (poly on OD edge)" in some embodiments.

In some embodiments, within the active areas 161 and 162, regions at opposite sides of the gate 153 are each a source/drain region. The term "source/drain region" is referred to as a region that is a source region or a drain region, in the present disclosure.

In some embodiments, at least one of the gates 151, 152 and 154 is arranged as a dummy gate. The dummy gate does not act as a gate to any transistor.

As illustrated in FIG. 1, the semiconductor structure 100 also includes conductive metal segments 131-136. The conductive metal segments 132 and 133 are disposed over the active area 161. The conductive metal segments 135 and 136 are disposed over the active area 162. The conductive metal segment 132 is arranged between the conductive metal segments 131 and 133. The conductive metal segment 135 is arranged between the conductive metal segments 134 and 136. In some embodiments, the term "conductive metal segments" discussed in the present disclosure are also referred to as "MOOD" or "MD."

In some embodiments, the height of at least one of the conductive metal segments 131 and 134 is greater than the height of at least one of the conductive metal segments 132, 133, 135, 136. In further embodiments, the height of each one of the conductive metal segments 131 and 134 is greater than the height of each one of the conductive metal segments 132, 133, 135, 136.

In some embodiments, the conductive metal segments 131 and 134 are formed on shallow trench isolation (STI) structures (not shown). The STI structures are formed, in some embodiments, by employing silicon oxide to fill shallow trenches for isolation. The formation of the conductive metal segments 131 and 134, as discussed above, are given for illustrative purposes. Various formations of the conductive metal segments 131 and 134 are within the contemplated scope of the present disclosure.

As illustrated in FIG. 1, the semiconductor structure 100 also includes conductive lines 111-114. In some embodiments, the conductive lines 111-114 are formed of metal. Various materials to form the conductive lines 111-114 are within the contemplated scope of the present disclosure.

For illustration, the conductive lines 111-114 are arranged in parallel with each other. The conductive line 111 is disposed over portions of the gates 151, 153, 154, and the conductive metal segments 131, 132. The conductive line 114 is disposed over portions of the gates 152, 153, 154, and the conductive metal segments 134, 135. The conductive line 113 is disposed over portions of the active area 162, the gates 152, 153, 154, and the conductive metal segments 134, 135, 136. The conductive line 112 crosses over the gate 153.

In some embodiments, the conductive line 112 is connected through a conductive via 125 to the gate 153. Effectively, the conductive line 112 is configured to receive a signal, and delivers the signal through the conductive via 125 to the gate 153.

In some embodiments, the conductive line 111 is a power supply line. The power supply line is configured to be coupled to, for illustration, a power supply VDD. In some embodiments, the conductive line 114 is a ground line. The ground line is configured to be coupled to, for illustration, a ground VSS.

The conductive line 111 is connected through a conductive via 122 and the conductive metal segment 132 to the source/drain region within the active area 161. Accordingly, there exists a current path (labeled 410 in FIG. 4) between the conductive line 111 and the conductive metal segment 132. The conductive line 111 is also connected through a conductive via 121 to the conductive metal segment 131.

The conductive line 114 is connected through a conductive via 124 and the conductive metal segment 135 to the source/drain region within the active area 162. Accordingly, there exists a current path between the conductive line 114 and the conductive metal segment 135. The conductive line 114 is also connected through a conductive via 123 to the conductive metal segment 134.

As illustrated in FIG. 1, the semiconductor structure 100 further includes local conductive segments 141 and 142. For illustration, the local conductive segment 141 crosses over the gate 151 and is disposed between the conductive metal segments 131 and 132 to connect the conductive metal segments 131 and 132. The local conductive segment 142 crosses over the gate 152 and is disposed between the conductive metal segments 134 and 135 to connect the conductive metal segments 134 and 135. In some embodiments, the term "local conductive segment" discussed in the present disclosure is also referred to as "MP."

In some embodiments, the local conductive segment 141 is connected to the gate 151, and/or the local conductive segment 142 is connected to the gate 152.

Figure 3:
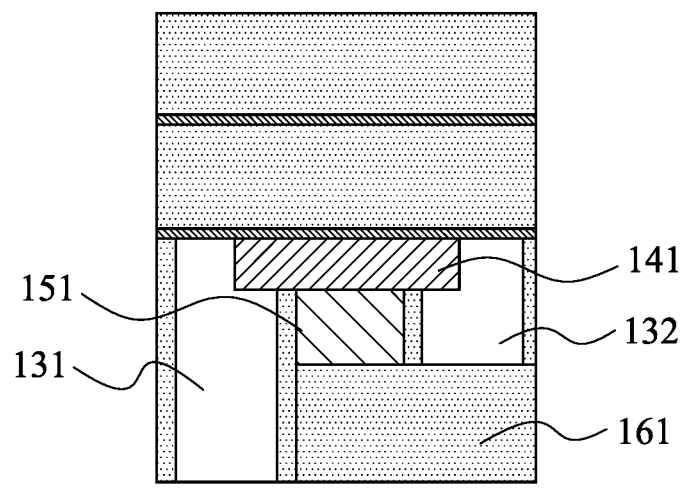
FIG. 3 is a cross sectional view taken along a line 3-3 in FIG. 1, in accordance with some embodiments of the present disclosure.

In some embodiments, the height of the local conductive segment 141 plus the height of the gate 151 is substantially equal to the height of the conductive metal segment 132, as shown in FIG. 3. Correspondingly, the height of the local conductive segment 142 plus the height of the gate 152 is substantially equal to the height of the conductive metal segment 135 in some embodiments.

The local conductive segment 141 is configured to electrically connect the conductive metal segments 131 and 132. In some embodiments, an end of the local conductive segment 141 is in contact with the conductive metal segment 131, and an opposite end of the local conductive segment 141 is in contact with the conductive metal segment 132. In some other embodiments, the local conductive segment 141 has opposite ends disposed within the conductive metal segments 131 and 132. Accordingly, the conductive metal segments 131 and 132 are electrically connected to each other through the local conductive segment 141. As a result, there exists an additional current path (labeled 420 in FIG. 4) between the conductive metal segments 131 and 132.

The local conductive segment 142 is configured to electrically connect the conductive metal segments 134 and 135. In some embodiments, an end of the local conductive segment 142 is in contact with the conductive metal segment 134, and an opposite end of the local conductive segment 142 is in contact with the conductive metal segment 135. In some other embodiments, the local conductive segment 142 has opposite ends disposed within the conductive metal segments 134 and 135. Accordingly, the conductive metal segments 134 and 135 are electrically connected to each other through the local conductive segment 142. As a result, there exists another additional current path between the conductive metal segments 134 and 135.

In some embodiments, at least one of the conductive lines 111-114, the conductive vias 121-125, the conductive metal segments 131-136, and the local conductive segments 141 and 142 of the semiconductor structure 100 is associated with, and/or formed in, the MEOL process. Accordingly, in some embodiments, a MEOL power strap includes the conductive line 111, the conductive vias 121, 122, the conductive metal segments 131, 132, and the local conductive segment 141, thereby providing aforementioned two current paths for power transmission.

Figure 2:
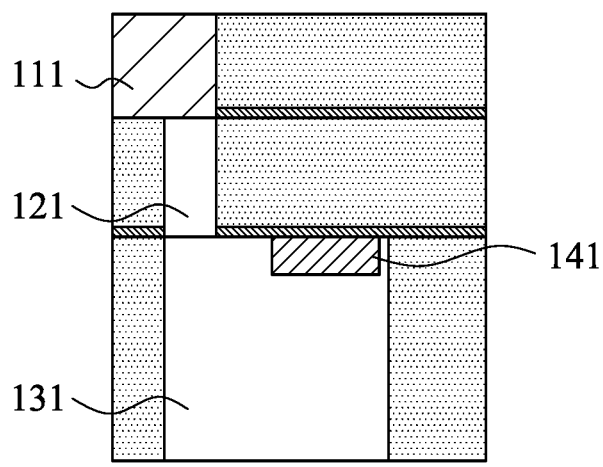
FIG. 2 is a cross sectional view taken along a line 2-2 in FIG. 1, in accordance with some embodiments of the present disclosure.

FIG. 2 is a cross sectional view taken along a line 2-2 in FIG. 1, in accordance with some embodiments of the present disclosure. FIG. 3 is a cross sectional view taken along a line 3-3 in FIG. 1, in accordance with some embodiments of the present disclosure. With respect to the embodiments of FIG. 1, like elements in FIG. 2 and FIG. 3 are designated with the same reference numbers for ease of understanding.

For illustration in FIG. 1 and FIG. 2, in a top-down sequence, the conductive line 111 is connected through the conductive via 121 to the conductive metal segment 131. A portion of the local conductive segment 141 is disposed within the conductive metal segment 131.

For illustration in FIG. 1 and FIG. 3, the opposite ends of the local conductive segment 141 are disposed within the conductive metal segments 131 and 132, respectively. The height of the conductive metal segment 131 is greater than the height of the conductive metal segment 132. The height of the local conductive segment 141 plus the height of the gate 151 is substantially equal to the height of the conductive metal segment 132, as illustrated in FIG. 3.

In some embodiments, the relationships and/or configurations of the conductive line 114, the conductive via 123, the conductive metal segments 134 and 135, the gate 152, and the active area 162 correspond to those illustrated in FIG. 2 and FIG. 3, and they are not further detailed herein for simplicity of illustration.

In some embodiments, the top surface of the local conductive segment 141 is substantially aligned with the top surface of the conductive metal segments 131 and 132, as illustrated in FIG. 3.

Figure 4:
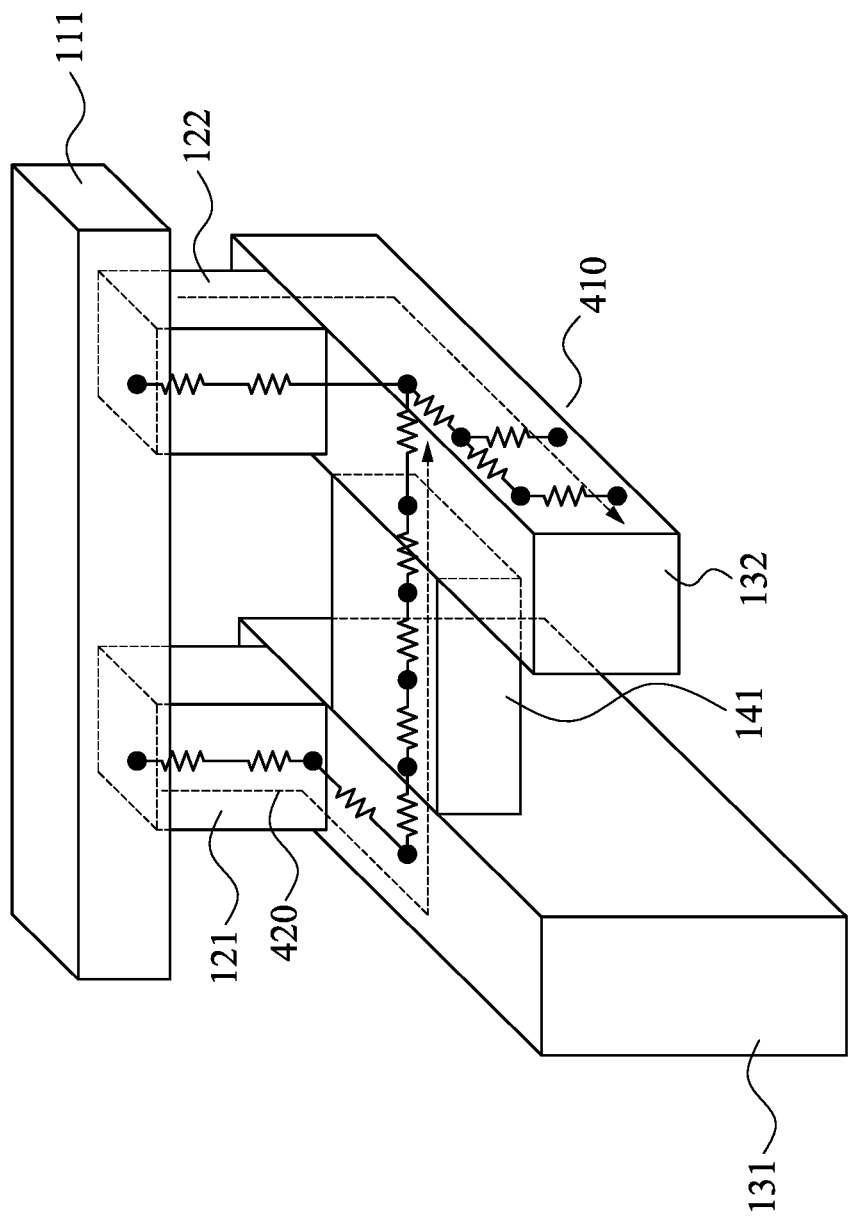
FIG. 4 is a perspective view of a portion of the semiconductor structure of FIG. 1, in accordance with some embodiments of the present disclosure.

FIG. 4 is a perspective view of a portion of the semiconductor structure 100 of FIG. 1, in accordance with some embodiments of the present disclosure. For ease of understanding, FIG. 4 is illustrated with reference to FIG. 2 and FIG. 3.

As discussed above, for illustration in FIG. 4, a current path 410 exists between the conductive line 111 and the conductive metal segment 132. In the current path 410, the current flows from the conductive line 111, through the conductive via 122, the conductive metal segment 132, to the active area 161.

Furthermore, an additional current path 420 exists between the conductive line 111 and the conductive metal segment 132. In the additional current path 420, the current flows from the conductive line 111, through the conductive via 121, the conductive metal segment 131, the local conductive segment 141, and the conductive metal segment 132, to the active area 161.

With the additional current path 420, current flow in the semiconductor structure 100 is increased. With the increased current flow, an increased equivalent resistance between the active area 161 and the conductive line 111 has less impact on performance of the semiconductor structure 100. Accordingly, the operation speed of devices implemented by the semiconductor structure 100 is able to improve.

Correspondingly, there exists an additional current path associated with the conductive line 114, the conductive via 123, the conductive metal segments 134 and 135, the local conductive segment 142, and the active area 162, and they are not further detailed herein for simplicity of illustration. Correspondingly, an increased equivalent resistance between the active area 162 and the conductive line 114 has less impact on performance of the semiconductor structure 100. Accordingly, the operation speed of devices implemented by the semiconductor structure 100 is able to improve as well.

Figure 5:
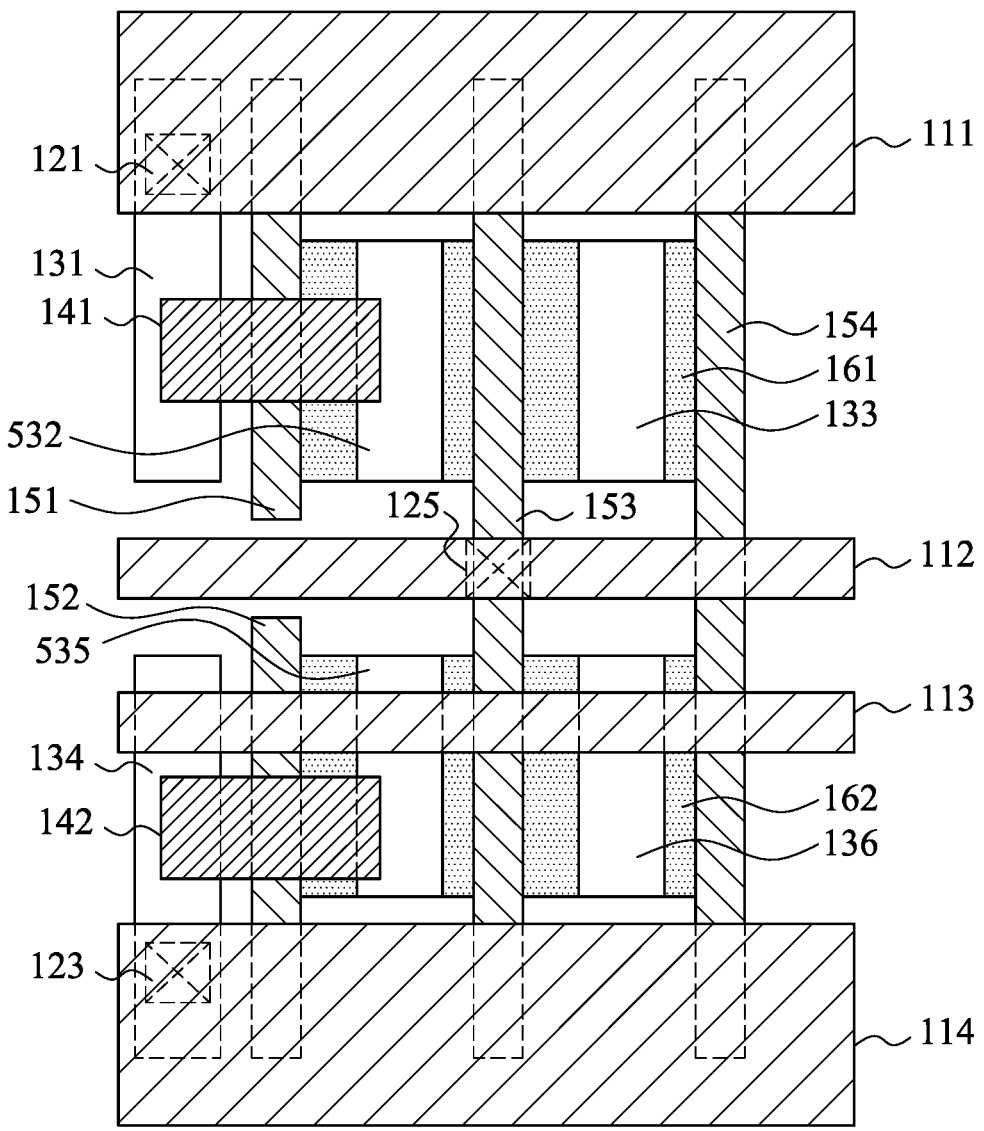
FIG. 5 is a top view of a schematic layout of a semiconductor structure, in accordance with some embodiments of the present disclosure.

FIG. 5 is a top view of a schematic layout of a semiconductor structure 500, in accordance with some other embodiments of the present disclosure. With respect to the embodiments of FIG. 1, like elements in FIG. 5 are designated with the same reference numbers and are not further detailed herein for simplicity of illustration. Compared to the semiconductor structure 100 in FIG. 1, the conductive vias 122 and 124 in FIG. 1 are not included in the semiconductor structure 500 in FIG. 5, and the conductive metal segments 132 and 135 in FIG. 1 are replaced with conductive metal segments 532 and 535, in some embodiments.

Compared with the conductive metal segment 132 in FIG. 1, the conductive metal segment 532 as illustrated in FIG. 5 is disposed over the active area 161, without extending longitudinally to be connected with the conductive line 111. Effectively, the length of the conductive metal segment 532 in FIG. 5 is shorter than the length of the conductive metal segment 132 in FIG. 1. As a result, parasitic capacitance (labeled 630 in FIG. 6) between the conductive metal segment 532 and the gate 153 is reduced.

In some embodiments, the length of the conductive metal segment 532 is substantially equal to the length of the conductive metal segment 133. In various embodiments, the height of the conductive metal segment 532 is substantially equal to the height of the conductive metal segment 133.

Compared with the conductive metal segment 135 in FIG. 1, the conductive metal segment 535 as illustrated in FIG. 5 is disposed over the active area 162, without extending longitudinally to be connected with the conductive line 114. Effectively, the length of the conductive metal segment 535 in FIG. 5 is shorter than the length of the conductive metal segment 135 in FIG. 1. As a result, parasitic capacitance between the conductive metal segment 535 and the gate 153 is reduced.

In some embodiments, the length of the conductive metal segment 535 is substantially equal to the length of the conductive metal segment 136. In various embodiments, the height of the conductive metal segment 535 is substantially equal to the height of the conductive metal segment 136.

In some embodiments, at least one of the conductive lines 111-114, the conductive vias 121, 123, 125, the conductive metal segments 131, 133, 134, 136, 532, 535, and the local conductive segments 141, 142 of the semiconductor structure 500 is associated with, and/or formed in, the MEOL process. Accordingly, in some embodiments, a MEOL power strap includes the conductive line 111, the conductive via 121, the conductive metal segments 131, 532, and the local conductive segments 141, thereby providing a current path (labeled 610 in FIG. 6) for power transmission.

Figure 6:
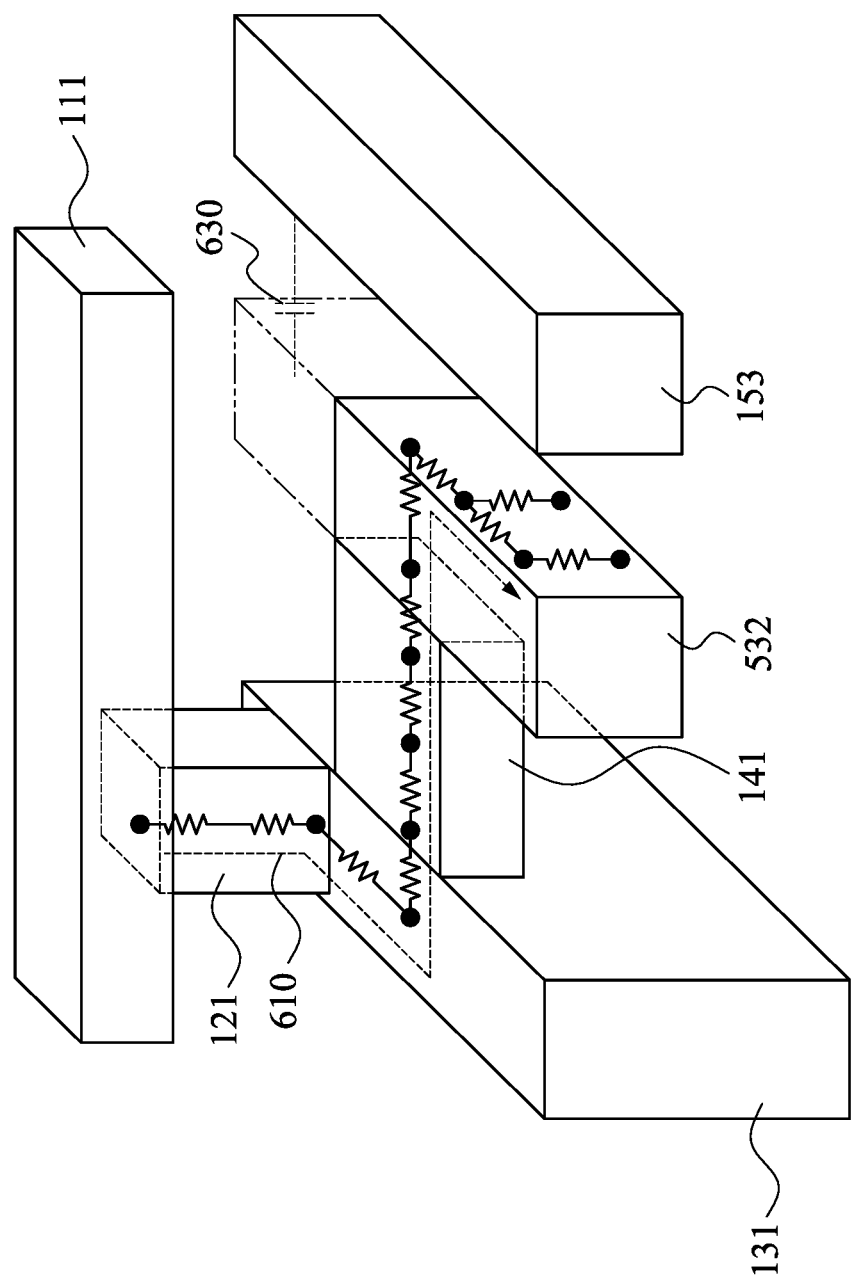
FIG. 6 is a perspective view of a portion of the semiconductor structure of FIG. 5, in accordance with some embodiments of the present disclosure.

FIG. 6 is a perspective view of a portion of the semiconductor structure 500 of FIG. 5, in accordance with some embodiments of the present disclosure. For illustration in FIG. 6, the current path 610 exists between the conductive line 111 and the conductive metal segment 532. In the current path 610, the current flows from the conductive line 111, through the conductive via 121, the conductive metal segment 131, the local conductive segment 141, and the conductive metal segment 532, to the active area 161 as illustrated in FIG. 5.

As discussed above, compared with the conductive metal segment 132 in FIG. 4, the conductive metal segment 532 has a relatively short length to reduce the parasitic capacitance 630 between the conductive metal segment 532 and the gate 153. Accordingly, the performance of devices implemented by the semiconductor structure 500 is able to improve.

Correspondingly, there exists a current path associated with the conductive line 114, the conductive via 123, the conductive metal segments 134 and 535, the local conductive segment 142, and the active area 162, and they are not further detailed herein for simplicity of illustration. Correspondingly, the conductive metal segment 535 has a relatively short length to reduce parasitic capacitance between the conductive metal segment 535 and the gate 153. Accordingly, the performance of devices implemented by the semiconductor structure 500 is able to improve as well.

Figure 7:
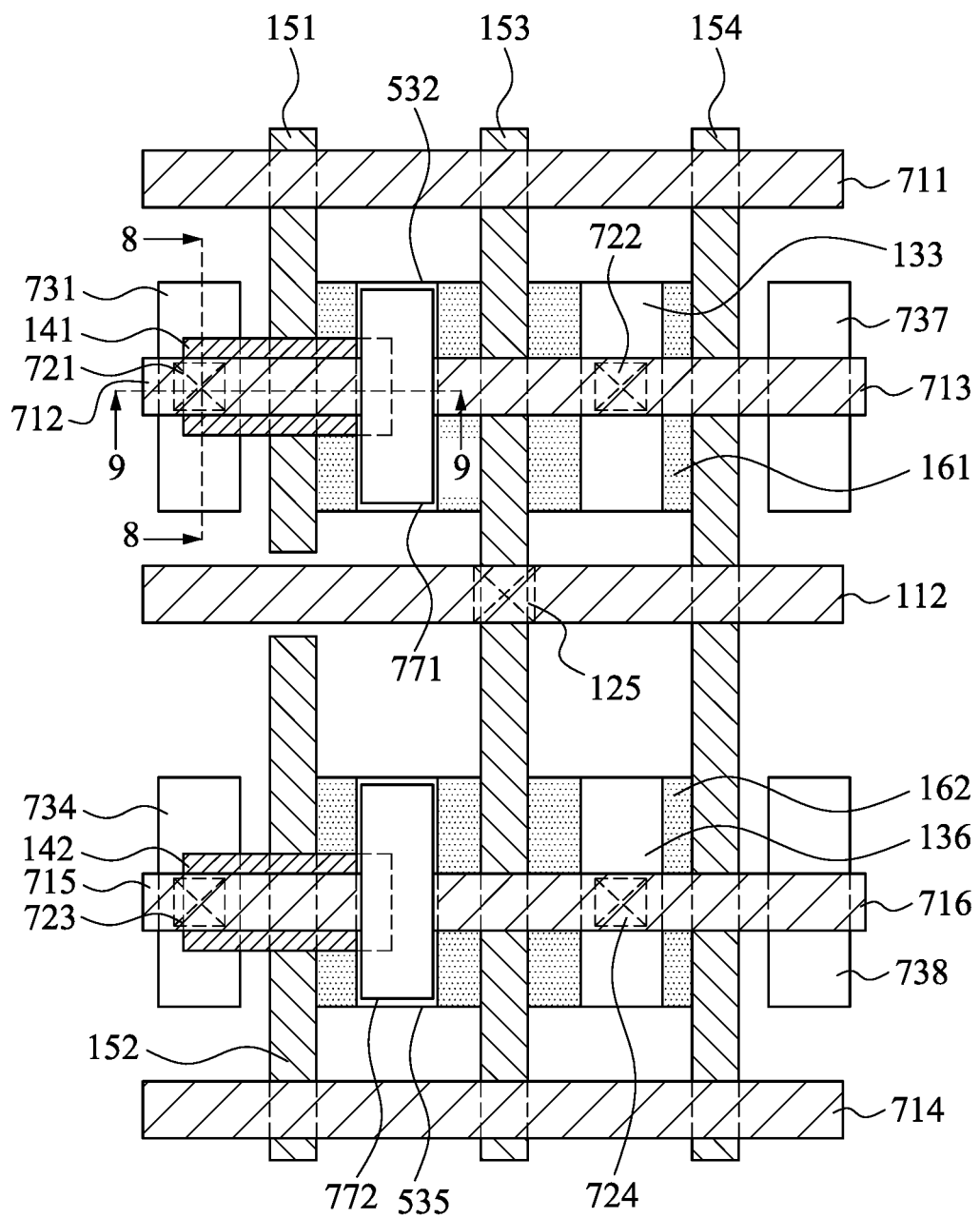
FIG. 7 is a top view of a schematic layout of a semiconductor structure, in accordance with some embodiments of the present disclosure.

FIG. 7 is a top view of a schematic layout of a semiconductor structure 700, in accordance with alternative embodiments of the present disclosure. With respect to the embodiments of FIG. 1 and FIG. 5, like elements in FIG. 7 are designated with the same reference numbers and are not further detailed herein for simplicity of illustration. Compared to the embodiments illustrated in FIG. 1 and FIG. 5, the semiconductor structure 700 in FIG. 7 has a various layout that will be discussed below.

As illustrated in FIG. 7, the semiconductor structure 700 includes conductive metal segments 731, 734, 737 and 738. The active area 161 is arranged between the conductive metal segments 731 and 737. The active area 162 is arranged between the conductive metal segments 734 and 738. In some embodiments, compared to the embodiments in FIG. 5, the length of the conductive metal segments 131 and/or 134 is greater than the length of the conductive metal segments 731 and/or 734, and the conductive metal segments 737 and 738 are additionally arranged.

In some embodiments, the height of at least one of the conductive metal segments 731, 734, 737 and 738 is greater than the height of at least one of the conductive metal segments 133, 136, 532 and 535 in FIG. 5. In further embodiments, the height of each one of the conductive metal segments 731, 734, 737 and 738 is greater than the height of each one of the conductive metal segments 133, 136, 532 and 535.

In some embodiments, the conductive metal segments 731, 734, 737 and 738 are formed on shallow trench isolation (STI) structures (not shown). The formation of the conductive metal segments 731, 734, 737 and 738, as discussed above, are given for illustrative purposes. Various formations of the conductive metal segments 731, 734, 737 and 738 are within the contemplated scope of the present disclosure.

For illustration in FIG. 7, the local conductive segment 141 is disposed between the conductive metal segments 731 and 532 to connect the conductive metal segments 731 and 532. The local conductive segment 142 is disposed between the conductive metal segments 734 and 535 to connect the conductive metal segments 734 and 535.

Figure 9:
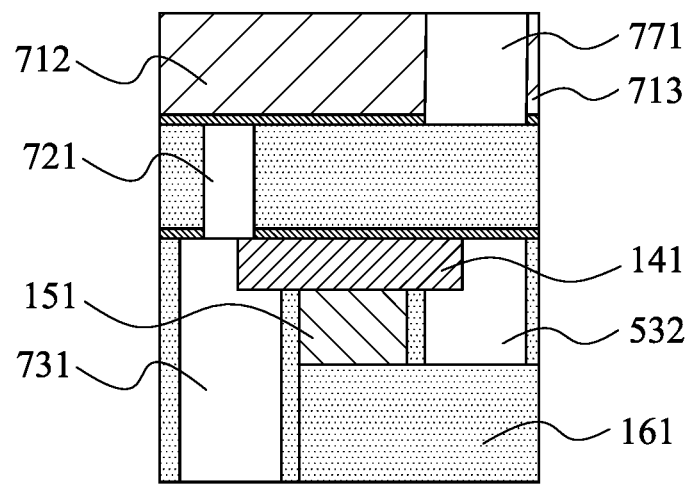
FIG. 9 is a cross sectional view taken along a line 9-9 in FIG. 7, in accordance with some embodiments of the present disclosure.

In some embodiments, the height of the local conductive segment 141 plus the height of the gate 151 is substantially equal to the height of the conductive metal segment 532, as shown in FIG. 9. Correspondingly, the height of the local conductive segment 142 plus the height of the gate 152 is substantially equal to the height of the conductive metal segment 535 in some embodiments.

The local conductive segment 141 is configured to electrically connect the conductive metal segments 731 and 532. In some embodiments, an end of the local conductive segment 141 is in contact with the conductive metal segment 731, and an opposite end of the local conductive segment 141 is in contact with the conductive metal segment 532. In some other embodiments, the local conductive segment 141 have opposite ends disposed within the conductive metal segments 731 and 532, as shown in FIG. 9.

Correspondingly, the local conductive segment 142 is configured to electrically connect the conductive metal segments 734 and 535. In some embodiments, an end of the local conductive segment 142 is in contact with the conductive metal segment 734, and an opposite end of the local conductive segment 142 is in contact with the conductive metal segment 535. In some other embodiments, the local conductive segment 142 has opposite ends disposed within the conductive metal segments 734 and 535.

As illustrated in FIG. 7, compared to the embodiments in FIG. 5, the semiconductor structure 700 includes conductive lines 711-716. For illustration, each one of the conductive lines 711-716 is arranged in parallel with the conductive line 112. In some embodiments, the conductive lines 711-716 are formed of metal. Various materials to form the conductive lines 711-716 are within the contemplated scope of the present disclosure.

For illustration, each of the conductive lines 711-716 is arranged in parallel with the conductive line 112. The conductive line 711 is disposed over portions of the gates 151, 153 and 154. The conductive line 714 is disposed over portions of the gates 152, 153 and 154. The conductive line 712 is arranged in line with the conductive line 713. The conductive line 712 is disposed over portions of the conductive metal segment 731, the gate 151 and the active area 161. The conductive line 713 is disposed over portions of the active area 161, the conductive metal segments 133 and 737, and the gates 153 and 154. The conductive line 715 is arranged in line with the conductive line 716. The conductive line 715 is disposed over portions of the conductive metal segment 734, the gate 152 and the active area 162. The conductive line 716 is disposed over portions of the active area 162, the conductive metal segment 136 and 738, and the gates 153 and 154.

In some embodiments, the conductive line 713 is connected through a conductive via 722 to the conductive metal segment 133. Effectively, the conductive line 713 is configured to transmit a signal outputted from the conductive metal segments 133. In some embodiments, the conductive line 716 is connected through a conductive via 724 to the conductive metal segments 136. Effectively, the conductive line 716 is configured to transmit a signal outputted from the conductive metal segments 136.

In some embodiments, the conductive line 712 is a power supply line. The power supply line is configured to be coupled to, for illustration, a power supply VDD. In some embodiments, the conductive line 715 is a ground line. The ground line is configured to be coupled to, for illustration, a ground VSS.

For illustration, the conductive line 712 is connected through a conductive via 721, the local conductive segment 141 and the conductive metal segment 532 to the source/drain region within the active area 161. Accordingly, there exists a current path between the conductive line 712 and the conductive metal segment 532.

For illustration, the conductive line 715 is connected through a conductive via 723, the local conductive segment 142 and the conductive metal segment 535 to the source/drain region within the active area 162. Accordingly, there exists a current path between the conductive line 715 and the conductive metal segment 535.

In some embodiments, at least one of the conductive lines 711-716, the conductive via 721-724, the conductive metal segments 133, 136, 532, 535, 731, 734, 737, 738 and the local conductive segments 141, 142 of the semiconductor structure 700 is associated with, and/or formed in, the MEOL process. Accordingly, in some embodiments, a MEOL strap includes the conductive line 712, the conductive via 721, the conductive metal segments 731, 532, and the local conductive segment 141, thereby providing aforementioned current path for power and/or signal transmission.

As illustrated in FIG. 7, the semiconductor structure 700 also includes isolation segments 771 and 772 in some embodiments. For illustration, the isolation segment 771 is disposed between the conductive line 712 and conductive line 713. Accordingly, in some embodiments, the conductive line 712 and the conductive line 713 are electrically isolated from each other by the isolation segment 771. The isolation segment 772 is disposed between the conductive line 715 and conductive line 716. Accordingly, in some embodiments, the conductive line 715 and the conductive line 716 are electrically isolated from each other by the isolation segment 772.

In some embodiments, the isolation segments 771 and 772 are formed of electrical insulation materials, while the conductive lines 712, 713, 715 and 716 are formed of metal. Accordingly, in some embodiments, the term "isolation segment" discussed in the present disclosure is also referred to as "CutMetal."

In some embodiments, the conductive via 721 is disposed right over the conductive metal segment 731. Accordingly, there has sufficient space for formations of the isolation segment 771 to separate the conductive line 712 and the conductive line 713.

In some embodiments, the isolation segment 771 is arranged right over the conductive metal segment 532, as shown in FIG. 9. Correspondingly, the isolation segment 772 is arranged directly over the conductive metal segment 535 in some embodiments.

Figure 8:
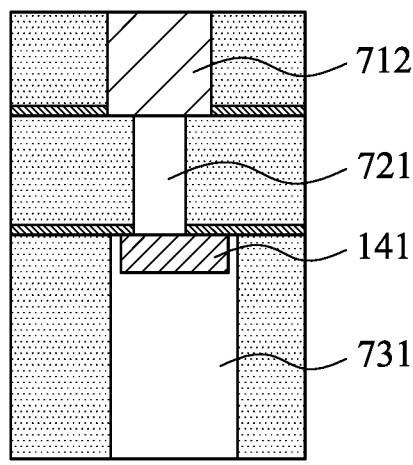
FIG. 8 is a cross sectional view taken along a line 8-8 in FIG. 7, in accordance with some embodiments of the present disclosure.

FIG. 8 is a cross sectional view taken along a line 8-8 in FIG. 7, in accordance with some embodiments of the present disclosure. FIG. 9 is a cross sectional view taken along a line 9-9 in FIG. 7, in accordance with some embodiments of the present disclosure. With respect to the embodiments of FIG. 7, like elements in FIG. 8 and FIG. 9 are designated with the same reference numbers for ease of understanding.

For illustration in FIG. 7 and FIG. 8, in a top-down sequence, the conductive line 712 is connected through the conductive via 721 to the local conductive segment 141. A portion of the local conductive segment 141 is disposed within the conductive metal segment 731.

For illustration in FIG. 7 and FIG. 9, the opposite ends of the local conductive segment 141 are disposed within the conductive metal segments 731 and 532, respectively. The bottom end of conductive via 721 is in contact with the conductive metal segment 731 and the local conductive segment 141. The height of the conductive metal segment 731 is greater than the height of the conductive metal segment 532. The height of the local conductive segment 141 plus the height of the gate 151 is substantially equal to the height of the conductive metal segment 532, as illustrated in FIG. 9.

In some embodiments, the top surface of the local conductive segment 141 is substantially aligned with the top surface of the conductive metal segments 731 and 532, as illustrated in FIG. 9.

In some embodiments, the top surface of the conductive lines 712 and 713 are substantially aligned with the top surface of the conductive metal segments 771, as illustrated in FIG. 9.

In some embodiments, the relationships and/or configurations of the conductive line 715, the conductive via 723, the conductive metal segments 734 and 535, the gate 152, and the active area 162 correspond to those illustrated in FIG. 8 and FIG. 9, and they are not further detailed herein for simplicity of illustration.

In some embodiments, a semiconductor structure is disclosed that includes a first conductive line, a first conductive segment, a second conductive segment, and a gate. The first conductive segment is electrically coupled to the first conductive line through a conductive via. The second conductive segment is configured to electrically couple the first conductive segment with a third conductive segment disposed over an active area. The gate is disposed under the second conductive segment and disposed between first conductive segment and the third conductive segment. The first conductive line and the second conductive segment are disposed at two sides of the conductive via respectively. A length of the first conductive segment is greater than a length of the third conductive segment.

Also disclosed is a method that includes disposing a first conductive segment, disposing a first conductive via above the first conductive segment, disposing a first conductive line above the first conductive via, and disposing a second conductive segment electrically coupled to the first conductive line through a third conductive segment, the first conductive segment, and the first conductive via.

Also disclosed is a semiconductor structure that includes a first conductive segment, a first conductive via, a first conductive line, and a second conductive segment. The first conductive via is above the first conductive segment. The first conductive line is above the first conductive via. The second conductive segment is electrically coupled to the first conductive line through a third conductive segment, the first conductive segment, and the first conductive via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first conductive line;
   a first conductive segment electrically coupled to the first conductive line through a conductive via;
   a second conductive segment configured to electrically couple the first conductive segment with a third conductive segment disposed over an active area and disposed between the first conductive segment and the third conductive segment; and
   a gate disposed between first conductive segment and the third conductive segment,
   wherein a top surface of the second conductive segment is above a top surface of the gate,
   wherein a top surface of the third conducive segment is aligned with the top surface of the second conductive segment in a same layer.

2. The semiconductor structure of claim 1, wherein a height of the first conductive segment is greater than a height of the third conductive segment.

3. The semiconductor structure of claim 1, wherein the first conductive segment and the third conductive segment are disposed at two sides of the second conductive segment.

4. The semiconductor structure of claim 1, wherein a current path is formed from the first conductive line through the conductive via and the second conductive segment to the third conductive segment.

5. The semiconductor structure of claim 1, wherein one end of the conductive via is in contact with the first conductive line, and another end of the conductive via is in contact with a portion of the first conductive segment.

6. The semiconductor structure of claim 1, further comprising:
   a second conductive line electrically coupled to a fourth conductive segment through a second conductive via, wherein the fourth conductive segment is disposed over the active area.

7. The semiconductor structure of claim 6, wherein the second conductive line and the first conductive line are parallel to each other.

8. A semiconductor structure, comprising:
   a first conductive segment;
   a first conductive via above the first conductive segment;
   a first conductive line above the first conductive via;
   a second conductive segment electrically coupled to the first conductive line through a third conductive segment, the first conductive segment, and the first conductive via; and
   a gate, wherein the third conductive segment crosses over the gate.

9. The semiconductor structure of claim 8, wherein a portion of the third conductive segment is disposed within the first conductive segment.

10. The semiconductor structure of claim 8, wherein opposite ends of the third conductive segment are disposed within the first conductive segment and second conductive segment respectively.

11. The semiconductor structure of claim 8, wherein a top surface of the third conductive segment is aligned with a top surface of the first conductive segment and a top surface of the second conductive segment.

12. The semiconductor structure of claim 8,
    wherein the gate is underneath the third conductive segment.

13. The semiconductor structure of claim 12, wherein a height of the gate plus a height of the third conductive segment is substantially equal to a height of the second conductive segment.

14. The semiconductor structure of claim 12, wherein the gate is disposed between the first conductive segment and the second conductive segment.

15. A semiconductor structure, comprising:
    a first conductive line;
    a first conductive segment electrically coupled to the first conductive line through a conductive via;
    a second conductive segment configured to electrically couple the first conductive segment with a third conductive segment disposed over an active area and disposed between the first conductive segment and the third conductive segment; and
    a gate disposed between first conductive segment and the third conductive segment,
    wherein a height of the first conductive segment is greater than a height of the third conductive segment,
    wherein a top surface of the third conducive segment is aligned with a top surface of the second conductive segment in a same layer.

16. The semiconductor structure of claim 15, wherein the first conductive segment and the third conductive segment are disposed at two sides of the second conductive segment.

17. The semiconductor structure of claim 15, wherein a current path is formed from the first conductive line through the conductive via and the second conductive segment to the third conductive segment.

18. The semiconductor structure of claim 15, wherein one end of the conductive via is in contact with the first conductive line, and another end of the conductive via is in contact with a portion of the first conductive segment.

19. The semiconductor structure of claim 15, further comprising:
    a second conductive line electrically coupled to a fourth conductive segment through a second conductive via, wherein the fourth conductive segment is disposed over the active area.

20. The semiconductor structure of claim 19, wherein the second conductive line and the first conductive line are parallel to each other.

* * * * *